United States Patent
Chen

(10) Patent No.: US 7,432,601 B2
(45) Date of Patent: Oct. 7, 2008

(54) SEMICONDUCTOR PACKAGE AND FABRICATION PROCESS THEREOF

(75) Inventor: Cheng-Pin Chen, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 11/544,934

(22) Filed: Oct. 10, 2006

(65) Prior Publication Data
US 2008/0093748 A1   Apr. 24, 2008

(51) Int. Cl.
*H01L 21/00* (2006.01)
(52) U.S. Cl. ............. 257/778; 257/787; 257/E21.499; 257/E23.06; 438/108; 438/127
(58) Field of Classification Search ............... 438/108, 438/127, 51, 55; 257/619, 692, 738, 778, 257/787, E21.499, E23.06, 782–784, E21.503
See application file for complete search history.

(56) References Cited

U.S. PATENT DOCUMENTS

| 5,679,977 A | 10/1997 | Khandros et al. ........... 257/692 |
| 6,628,526 B1* | 9/2003 | Oshima et al. ............. 361/760 |
| 2004/0041279 A1* | 3/2004 | Fuller et al. ................ 257/782 |

* cited by examiner

*Primary Examiner*—Matthew S. Smith
*Assistant Examiner*—Walter Swanson
(74) *Attorney, Agent, or Firm*—Troxell Law Office, PLLC

(57) ABSTRACT

A semiconductor package mainly includes a chip, a substrate, an encapsulant, a plurality of external terminals and a stress release layer. The substrate has an upper surface and a lower surface. The chip is disposed on the upper surface of the substrate by a chip-attached layer and electrically connected to the substrate. The encapsulant is formed above the upper surface of the substrate. The external terminals are disposed on the lower surface of the substrate. The stress release layer is formed on the interface of the substrate and the encapsulant such that the external terminals are movable with respect to the encapsulated chip. In addition, a fabrication process of the semiconductor package is also disclosed.

10 Claims, 6 Drawing Sheets

SEMICONDUCTOR PACKAGE AND FABRICATION PROCESS THEREOF

FIELD OF THE INVENTION

The present invention relates to semiconductor packaging technique, more particularly to a semiconductor package, which enhances product reliability of TCT (Temperature Cycle Test) efficiency.

BACKGROUND OF THE INVENTION

Conventional semiconductor packages have a plurality of external terminals such as solder balls, solder pastes, metal pins or metal pads, which are disposed at a substrate bottom to serve for surface mounting to an external PCB (Printed Circuit Board). The IC packages after fabrication should pass reliability tests in which TCT is one of reliability test items for semiconductor package product at the moment. However, due to a CTE (Coefficient of Thermal Expansion) mismatch existing between semiconductor package and external PCB, the external terminals are subjected to thermal stress to damage or crack during repeated up-and-down temperature cycles.

Referring to FIG. 1, a conventional semiconductor package 100 includes a substrate 110, a chip 120, an encapsulant 130 and a plurality of external terminals 140. The chip 120 is disposed on an upper surface 111 of the substrate 110 by a chip-attached layer 121 and bonding pads 122 of the chip 120 are electrically connected to the substrate 120 by a plurality of bonding wires 150. The encapsulant 130 is formed on the upper surface 111 of the substrate 110 to encapsulate the chip 120. Because the encapsulant 130 after fully cure is a relatively hard compound, the thermal stress generating during TCT concentrates on some of the external terminals 140 under the substrate 110, especially located at edges and corners of the lower surface 112 of the substrate 110, resulting in damage such as crack or electrical disconnection. A known solution of cracking problem is to apply a corner-bond adhesive at corners of the substrate 110 after surface-mounting the package 100 to fix corners of the substrate 110 so as to prevent the external terminals 140 from cracking. However, this treatment does not belong to a standard SMT fabrication process and results in rework difficulty. Not only an extra thermosetting process for the corner bond is needed resulting in SMT cost up, but also the semiconductor package 100 cannot be repaired or replaced after SMT.

A related solution had disclosed in U.S. Pat. No. 5,679,977, which shows a semiconductor chip assembly. Conventional full-surface covering encapsulate (or called molding compound) has disappeared. Additionally, flexible leads of flexible substrate are applied to connect the chip from the external terminals, the chip-attached layer between the chip and the flexible substrate is a compliant layer having resilience or low modulus, thus the external terminals may be movable with respect to the chip. However, this method mentioned above can be applied only for the non-encapsulant semiconductor chip assembly, not suitable for the conventional semiconductor package needing a rigid encapsulant bacause the encapsulant will re-fix the flexible substrate and the chip after curing resulting in the external terminals immovable with respect to the chip.

SUMMARY OF THE INVENTION

In order to solve the problems mentioned above, the primary object of the present invention is to provide a semiconductor package, which has movable external terminals with respect to the chip even after encapsulation to prevent that generated thermal stress concentrates on the partial external terminals during repeated up-and down temperature cycles The secondary object of the present invention is to provide a semiconductor package, which prevents the encapsulant from directly and mechanically coupling to the substrate that allows the substrate and the external terminals to have horizontal flexibility.

The third object of the present invention is to provide a semiconductor package, which prevents one ends of bonding wires connecting to the substrate from cracking.

One aspect of the present invention provides a semiconductor package comprising a substrate, a chip, an encapsulant, a plurality of external terminals and a stress release layer. The substrate has an upper surface and a lower surface, and the chip is disposed on the upper surface of the substrate by a chip-attached layer and electrically connected to the substrate. The encapsulant is formed above the upper surface to encapsulate the chip. The external terminals are disposed on the lower surface. The stress release layer is formed on the interface of the substrate and the encapsulant such that the external terminals are movable with respect to the encapsulated chip. Also the fabrication process of the semiconductor package is disclosed thereafter.

With regard to the semiconductor package mentioned above, Young's modulus of the stress release layer and the chip-attached layer may be smaller than that of the encapsulant.

With regard to the semiconductor package mentioned above, the stress release layer may be made of a same material as the chip-attached layer.

With regard to the semiconductor package mentioned above, the stress release layer the stress release layer may cover most of the exposed upper surface of the substrate so that the encapsulant does not directly contact the substrate.

With regard to the semiconductor package mentioned above, the stress release layer may be not thinner than the chip-attached layer.

With regard to the semiconductor package mentioned above, it may further comprise a plurality of bonding wires electrically connecting the chip to the substrate.

With regard to the semiconductor package mentioned above, one ends of the bonding wires on the substrate may be sealed by the stress release layer.

With regard to the semiconductor package mentioned above, the substrate has a slot allowing that the bonding wires electrically connecting the substrate and the chip pass through the slot.

With regard to the semiconductor package mentioned above, the stress release layer may be formed in the slot.

DETAILED DESCRIPTION OF THE INVENTION

Figure 1:
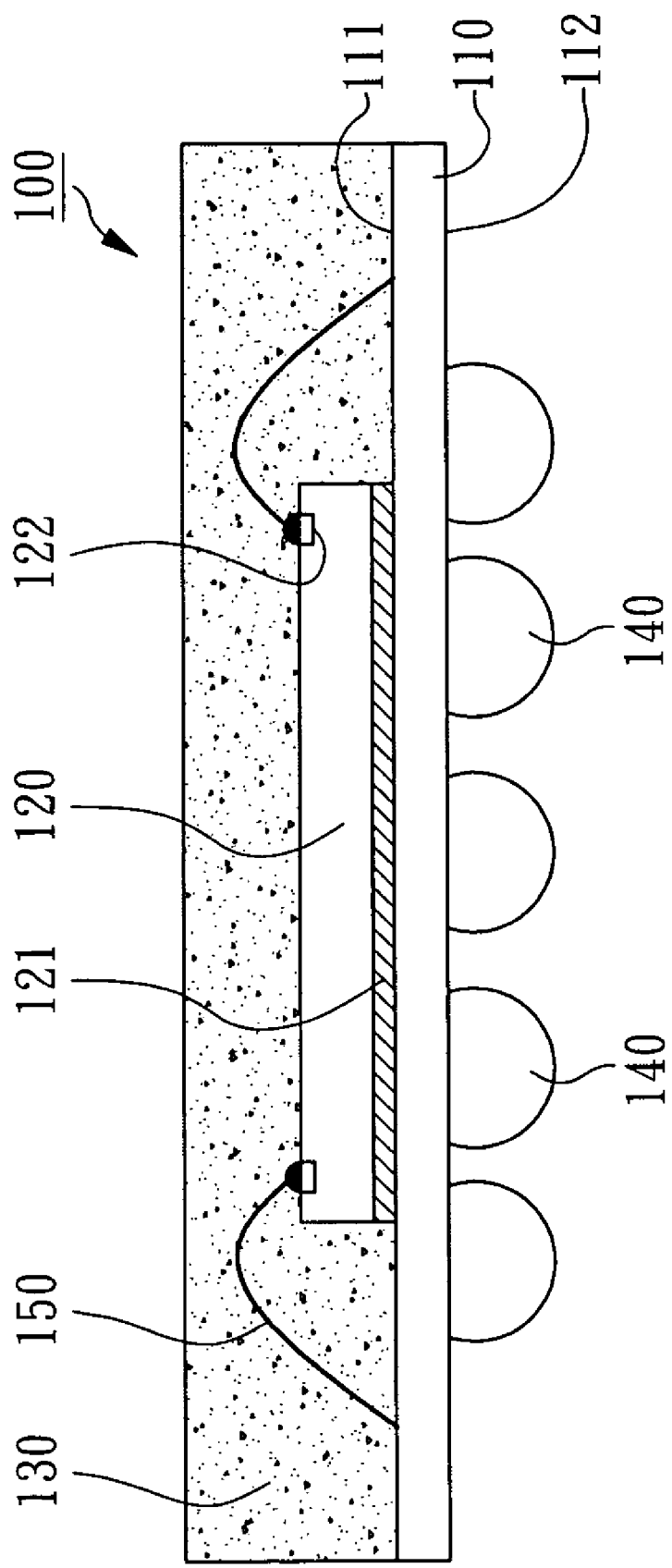
FIG. 1 is a cross-sectional view of a conventional semiconductor package.
Figure 2:
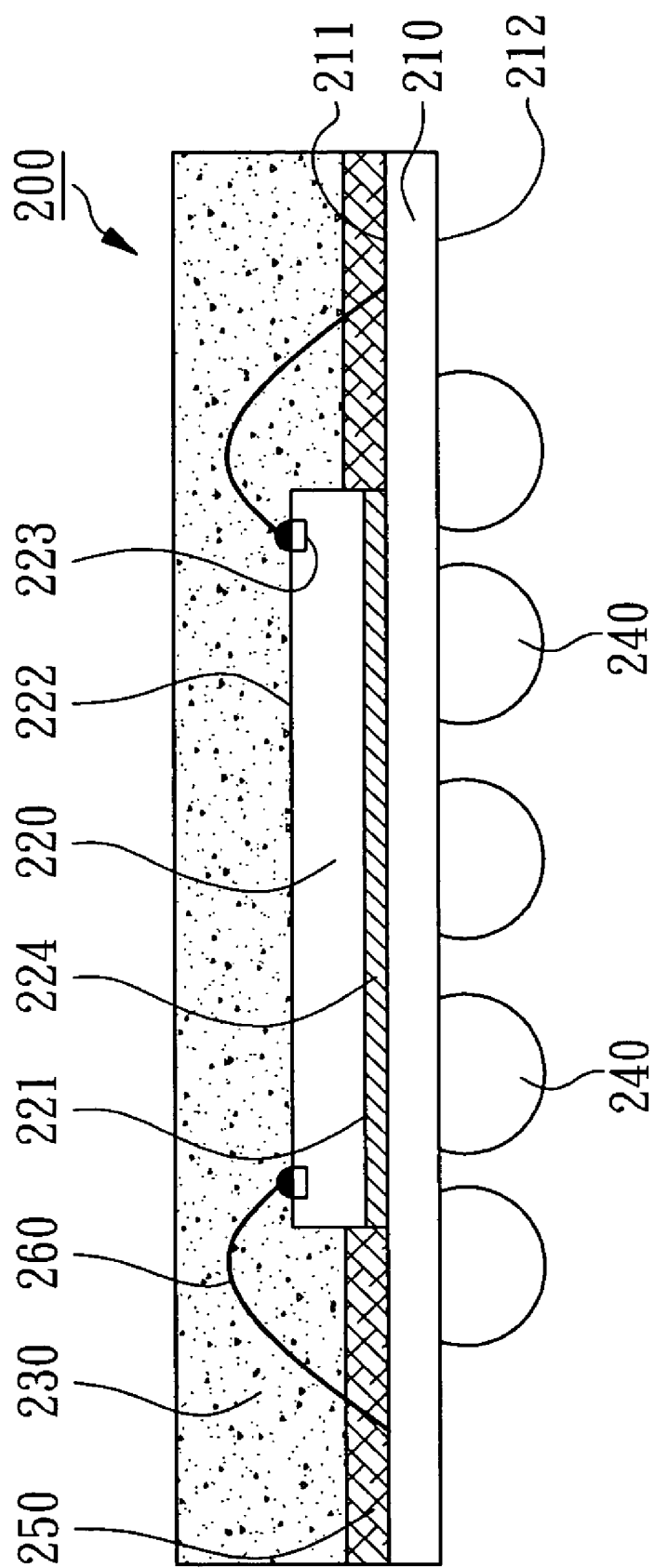
FIG. 2 is a cross-sectional view of a semiconductor package in accordance with the first embodiment of the present invention.

Referring to FIG. 2, a semiconductor package 200 is showed in accordance with the first embodiment of the present invention, comprising a substrate 210, a chip 220, an encapsulant 230, a plurality of external terminals 240 and a stress release layer 250. The substrate 210 is a chip carrier suitable for semiconductor package, such as high density PCB, ceramic substrate, or flexible circuit film. The substrate 210 has an upper surface 211, a lower surface 212 and includes proper wiring pattern(s) for electrically connecting the chip 220 to the external terminals 240, which may be single-layer or multi-layer or include PTHs (Plated Through Holes).

The chip 220 made of semiconductor material and also includes various micro components, such as integrated circuit, MEMS component (Micro Electro Mechanical System), or optoelectronic device. The chip 220 has an active surface 222 and an opposing back surface 221 and a plurality of bonding pads 223 may be formed on the active surface 222 or on the back surface 221 by applying through hole fabrication process of wafer (not showed in the drawings). A chip-attached layer 224 is disposed on the back surface 221 of the chip 220 or on the upper surface 211 of the substrate 210 to adhere the substrate 210 and the chip 220. The chip-attached layer 224 is normally made of epoxy or organic resin without containing inorganic filler to be softer than the encapsulant 230 in characteristic, and Young's modulus thereof may be lower than that of the encapsulant 230. Further, the chip 220 is electrically connected to the substrate 210 by a plurality of bonding wires 260. In this embodiment, the package 200 is a typical chip side-up type BGA package, one ends of the bonding wires 260 are connected to on the bonding pads 223 of the chip 220 and another ends of the bonding wires 260 are connected to the inner fingers (not showed in the drawings) located on the upper surface 211 of the substrate 210, and the bonding wires 260 are formed prior to forming the stress release layer 250 and the encapsulant 230.

The encapsulant 230 is formed above the upper surface 211 of the substrate 210 to encapsulate the chip 220. In this embodiment, the encapsulant 230 further seals the bonding wires 260. The encapsulant 230 may be formed by applying the molding or printing method and made of materials including thermosetting resins, inorganic fillers, dispersing agents and pigment. Normally the encapsulant 230 has excellent electrical insulation and rigid property in hardness after curing. Young's modulus of the encapsulant 230 is ranged from 10 GPa to 35 GPa according to distribution ratio of fabricating material enabling the encapsulant 230, approximately, 20 GPa is normal, so that the encapsulant 230 is not movable with respect to the chip 220. In practical processes, the encapsulant 230 is normally formed after forming the stress release layer 250.

The external terminal 240 are disposed on the lower surface 212 of the substrate 210 to be utilized for mounting to an external PCB (not showed in the drawings) by SMT technique. In this embodiment, the external terminals 240 include a plurality of solder balls.

The stress release layer 250 is formed on an interface of the substrate 210 and the encapsulant 230. Young's modulus of the stress release layer 250 and the chip-attached layer 224 are normally small than that of the encapsulant 230, for example controlled under 10 GPa. The area of that the encapsulant 230 directly coupling to the substrate 210 decreases, even disappears, that is to say the encapsulant 230 no longer catches the substrate 210, so that the external terminals 240 can become movable with respect to the encapsulated chip 220. The stress release layer 250 and the chip-attached layer 224 may be made of same or different material, for example the stress release layer 250 may be made of rubber or silica gel. In this embodiment, the-stress release layer 250 should have an enhanced moisture resistance, so the stress release layer 250 may have sides that are exposed at external edge of the encapsulant 230. Preferably, the stress release layer 250 is desirable to have a thickness thicker than that of the chip-attached layer 224 thereby obtaining better efficiency of stress release and stress absorbability, so that the thermal stress conducting from the external terminals 240 will be distributed or retained on the stress release layer 250 no more conducting to the encapsulated chip 220. Besides, the stress release layer 250 can cover most of the exposed surface before encapsulation located on the upper surface 211 of the substrate 210, so that the encapsulant 230 does not directly contact the substrate 210. Accordingly, the encapsulant 230 only catches the chip 220, without catching the substrate 210. Further, in this embodiment, the stress release layer 250 is formed after forming the bonding wires 260, one ends of the bonding wires 260 on the substrate 210 are sealed by the stress release layer 250 to prevent the ends of the bonding wires connecting on the substrate 210 from cracking. In addition, there is no cracking problem for the bonding wires 260 because they have ductile characteristic.

The semiconductor package 200 is configured for surface-mounting onto an external PCB. Due to the external terminals are appropriately movable with respect to the encapsulated chip 220, stress caused by CTC mismatch between the package 200 and external PCB can be overcome. Expansion and contraction of external PCB with respect to the encapsulant 230 during the process of TCT or actual IC operation to generate thermal stress, which may pass through the external terminals 240 to be released in the stress release layer 250. Therefore, each single external terminal 240 (especially located at the edge or corners of the substrate 210) won't bear overgreat thermal stress to encounter cracking problem, thereby passing the higher grade of TCT.

Figure 3A:
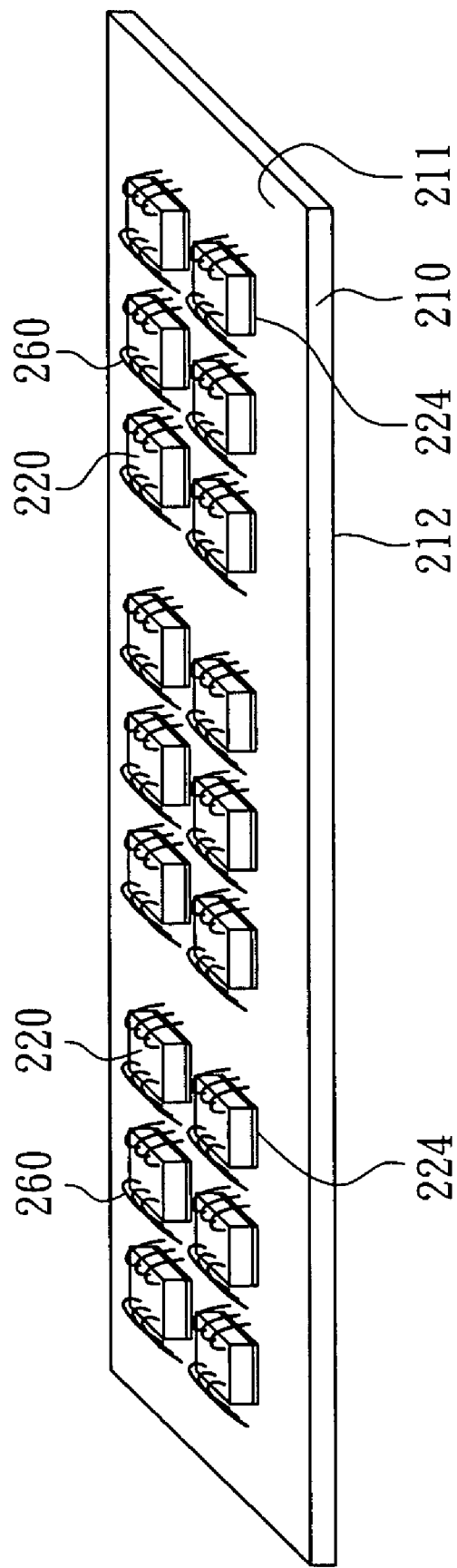
FIG. 3A to 3B illustrate the formation of a stress release layer for the semiconductor package prior to encapsulation in accordance with the first embodiment of the present invention
Figure 3B:
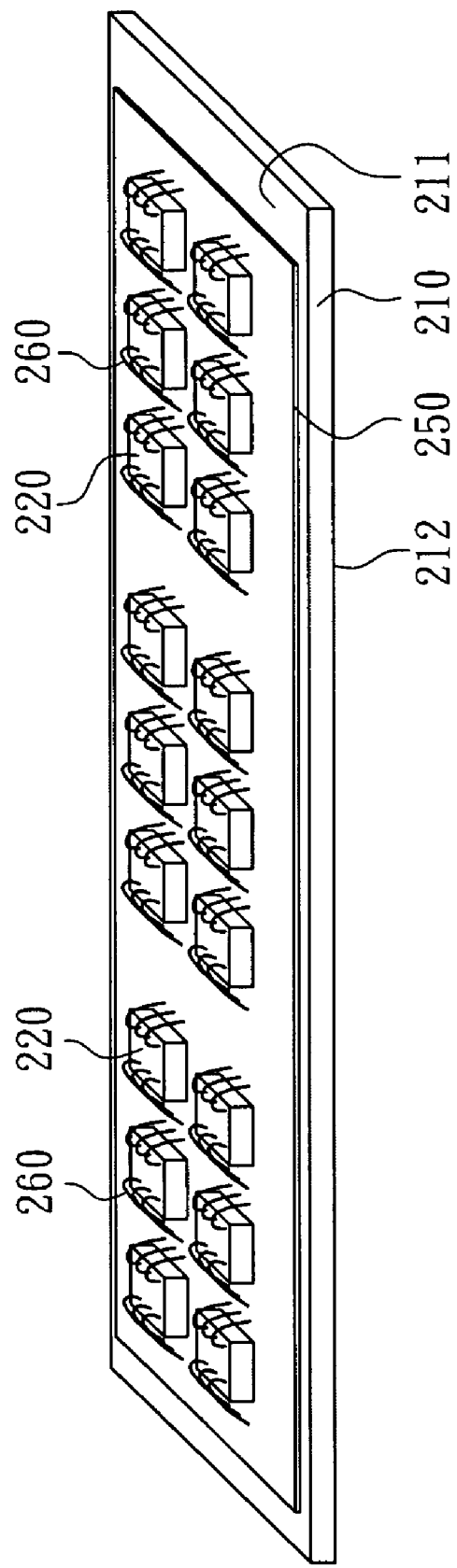

Referring to FIGS. 3A and 3B, a fabrication process of the semiconductor package 200 will be described as follows. First referring to FIG. 3A, a substrate 210 is provided, which is integrally formed in a substrate strip before singulation. Then, a chip-attaching performance is executed. A chip-attached layer 224 adheres a plurality of chips 220 onto the upper surfaces 211 of the corresponding substrates 210. Next, the chips 220 are electrically connected to the substrate 210 by a plurality of bonding wires 260 formed by wire bonding technique. Next referring to FIG. 3B, a stress release layer 250 is formed on the upper surface 211 of the substrate 210 by utilizing printing, dispensing, digital ink jetting or spray coating technique. Next referring to FIG. 2, an encapsulant 230 is formed above the upper surface 211 of the substrate 210. Meantime, the stress release layer 250 is located on the interface of the substrate 210 and the encapsulant 230. Next, a plurality of external terminals 240 are disposed on the lower surface 212 of the substrate 210 and are movable with respect to the encapsulated chip 220. Finally, the semiconductor package 200 mentioned above can be obtained after cutting the substrate 210.

Figure 4:
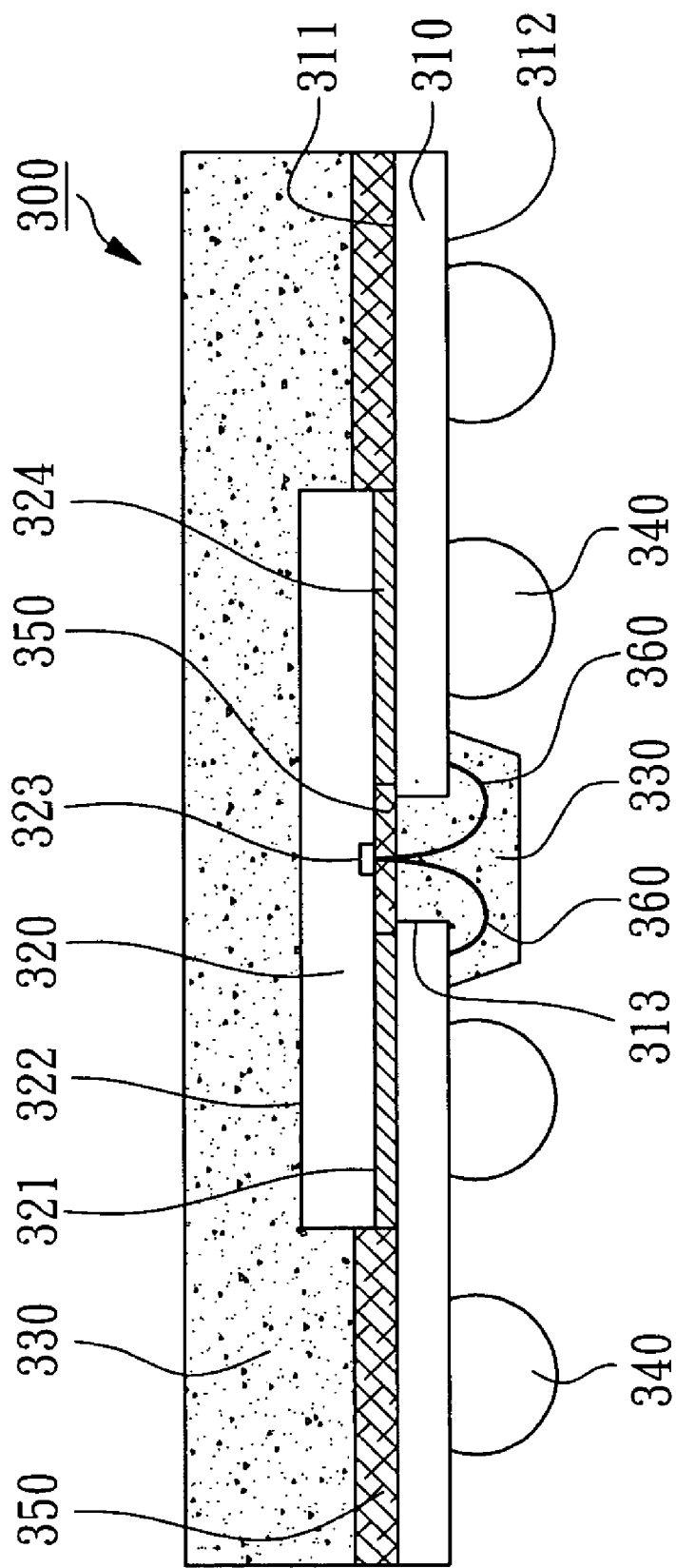
FIG. 4 is a cross-sectional view of a semiconductor package in accordance with the second embodiment of the present invention.

Another semiconductor package is disclosed in accordance with the second embodiment of the present invention. Referring to FIG. 4, the semiconductor package 300 comprises a substrate 310, a chip 320, an encapsulant 330, a plurality of external terminals 340 and a stress release layer 350. The substrate 310 has an upper surface 311, a lower surface 312 and a slot 313. An active surface 321 of the chip 320 is attached onto the upper surface 311 of the substrate 310 by a chip-attached layer 324 to allow the bonding pads 323 of the chip 320 to be exposed from the slot 313 and a back surface 322 of the chip 320 is away from the substrate 310. A plurality of bonding wires 360 pass through the slot 313 and electrically connect the bonding pads 323 of the chip 320 to the substrate 310. The encapsulant 330 is formed above the upper surface 311 of the substrate 310. In this embodiment, the encapsulant 330 may be further formed in the slot 313. The external terminals 340 are disposed on the lower surface 312 of the substrate 310. The stress release layer 350 is formed on the interface of the substrate 310 and the encapsulant 330 such that the external terminals 340 are movable with respect to the chip 320. In this embodiment, the stress release layer 350 is further formed in the slot 313, so that the encapsulant 330 encapsulating the bonding wires 360 in the slot 313 does not directly contact the active surface 321 of the chip 320.

Figure 5:
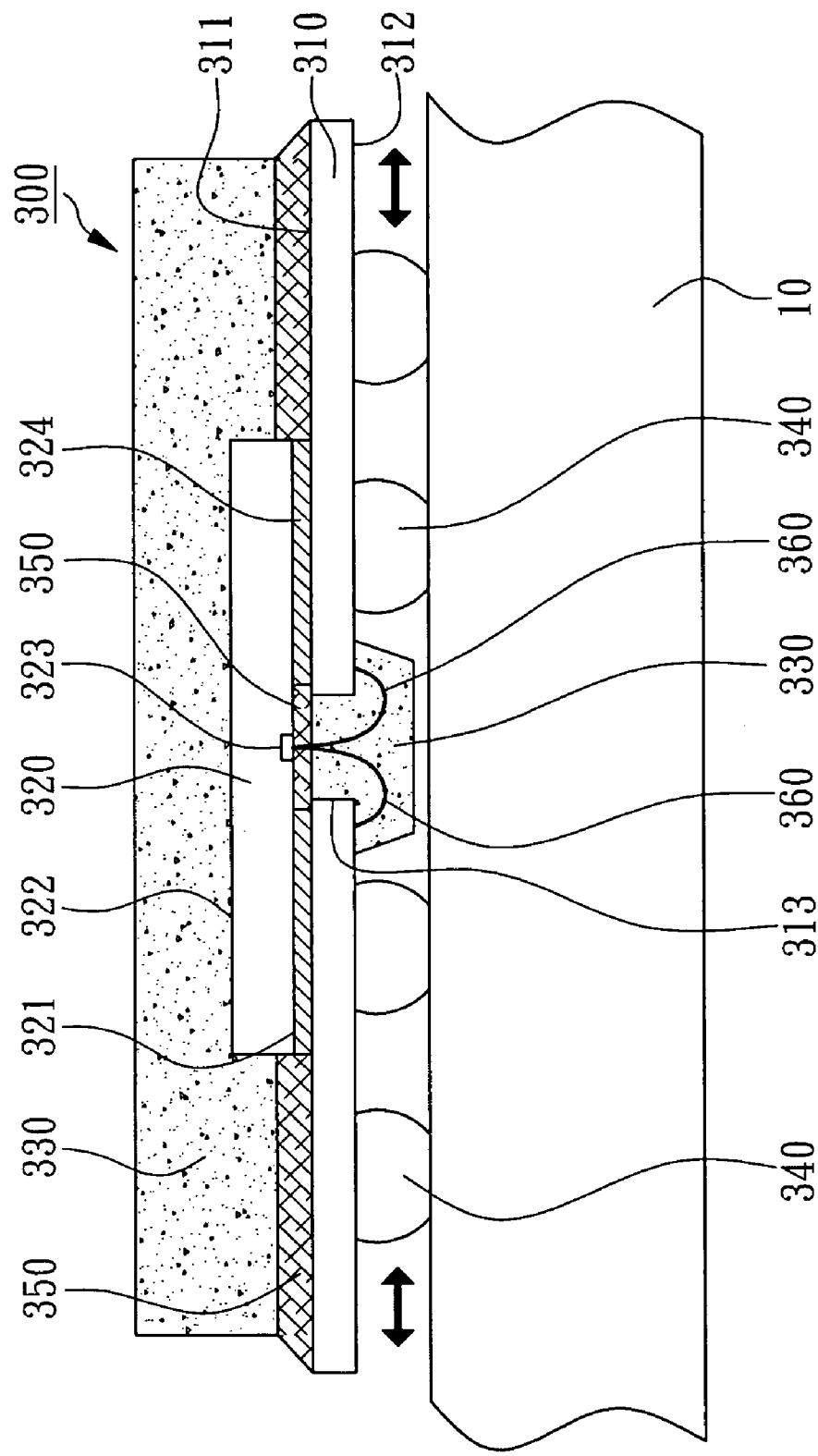
FIG. 5 is a cross-sectional view of the semiconductor package after SMT in accordance with the second embodiment of the present invention.

Referring to FIG. 5, the semiconductor package 300 is surface-mounted onto an external PCB 10. The external PCB 10 has a CTE (Coefficient of Thermal Expansion) greater than that of the encapsulant 330. Temperature variation results in movement of the external terminals 340. Because the stress release can be performed in the stress release layer 350 located between the substrate 310 and the encapsulant 330, the encapsulated semiconductor package 300 having movable external terminals 340 with respect to the encapsulated chip 320 as non-encapsulated chip assemblies overcomes the problem of terminal crack caused from conventional semiconductor package has immovable external terminals to pass the higher grade of TCT.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A semiconductor package comprising:
   a substrate having an upper surface and a lower surface;
   a chip disposed on the upper surface of the substrate by a chip-attached layer and electrically connected to the substrate;
   an encapsulant formed above the upper surface of the substrate to encapsulate the chip;
   a plurality of external terminals disposed on the lower surface of the substrate;
   a stress release layer formed on the interface of the substrate and the encapsulant; and
   a plurality of bonding wires electrically connecting the chip to the substrate,
   wherein one end of the bonding wires on the substrate are sealed by the stress release layer.

2. The semiconductor package in accordance with claim 1, wherein Young's modulus of the stress release layer and the chip-attached layer are smaller than that of the encapsulant.

3. The semiconductor package in accordance with claim 2, wherein the stress release layer is made of a same material as the chip-attached layer.

4. The semiconductor package in accordance with claim 1, wherein the stress release layer is not thinner than the chip-attached layer.

5. The semiconductor package in accordance with claim 1, wherein the external terminals include a plurality of solder balls.

6. A semiconductor package comprising:
   a substrate having an upper surface and a lower surface;
   a chip disposed on the upper surface of the substrate by a chip-attached layer and electrically connected to the substrate;
   an encapsulant formed above the upper surface of the substrate to encapsulate the chip;
   a plurality of external terminals disposed on the lower surface of the substrate;
   a stress release layer formed on the interface of the substrate and the encapsulant; and
   a plurality of bonding wires electrically connecting the chip to the substrate,
   wherein the substrate has a slot allowing the bonding wires pass therethrough for the electrical connections,
   wherein the stress release layer is further formed in the slot.

7. The semiconductor package in accordance with claim 6, wherein Young's modulus of the stress release layer and the chip-attached layer are smaller than that of the encapsulant.

8. The semiconductor package in accordance with claim 7, wherein the stress release layer is made of a same material as the chip-attached layer.

9. The semiconductor package in accordance with claim 6, wherein the stress release layer is not thinner than the chip-attached layer.

10. The semiconductor package in accordance with claim 6, wherein the external terminals include a plurality of solder balls.

* * * * *